(12) United States Patent
Zwijze et al.

(10) Patent No.: US 10,871,413 B2
(45) Date of Patent: Dec. 22, 2020

(54) METHOD OF MANUFACTURING A PRESSURE SENSOR

(71) Applicant: Sensata Technologies, Inc., Attleboro, MA (US)

(72) Inventors: Albert Ferdinand Zwijze, AH Vriezenveen (NL); Werner John Peter Kleissen, PT Hengelo (NL); Frank Hendri Jacobs, AJ Broekland (NL); Dedde Hedzer Wiersma, AE Zwolle (NL)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 901 days.

(21) Appl. No.: 15/479,332

(22) Filed: Apr. 5, 2017

(65) Prior Publication Data
US 2017/0307457 A1    Oct. 26, 2017

(30) Foreign Application Priority Data
Apr. 20, 2016    (EP) .................................... 16166285

(51) Int. Cl.
*G01L 9/04* (2006.01)
*G01L 9/00* (2006.01)
(Continued)

(52) U.S. Cl.
CPC .................. *G01L 9/04* (2013.01); *G01L 1/22* (2013.01); *G01L 9/0051* (2013.01);
(Continued)

(58) Field of Classification Search
CPC . G01L 9/04; G01L 1/22; G01L 9/0051; G01L 9/0055; G06F 30/20
(Continued)

(56) References Cited

U.S. PATENT DOCUMENTS 4,131,088 A    12/1978  Reddy
4,287,772 A     9/1981  Mounteer et al.
(Continued)

FOREIGN PATENT DOCUMENTS

CN    103454032 A    12/2013
DE      4234289 C1    11/1993
(Continued)

OTHER PUBLICATIONS

European Search Report for European Patent Application No. 16166285.3 dated Oct. 7, 2016, 12 pages.

*Primary Examiner* — Kamini S Shah
*Assistant Examiner* — Faraj Ayoub
(74) *Attorney, Agent, or Firm* — Mark H. Williams

(57) ABSTRACT

A method of manufacturing a pressure sensor is shown, wherein the pressure sensor comprises a port element with a sealing structure and a membrane. Four strain gages will be attached to the membrane. The gages are used in a Wheatstone bridge to sense the fluid pressure. A first finite element action determines a first contour around the membrane central axis with equal compressive strain and a second contour around the membrane central axis with equal tensile strain wherein when fluid pressure is applied to the membrane strain on the first contour is opposite strain on the second contour. A second finite element action determines the four positions of the strain gages on the first and second contour such that the difference between the highest error signal and the lowest error signal at the output of the Wheatstone bridge is minimal under influence of parasitic forces.

11 Claims, 9 Drawing Sheets

(51) Int. Cl.
*G01L 1/22* (2006.01)
*G06F 30/23* (2020.01)
*G06F 30/20* (2020.01)

(52) U.S. Cl.
CPC ............ *G01L 9/0055* (2013.01); *G06F 30/20* (2020.01); *G06F 30/23* (2020.01)

(58) Field of Classification Search
USPC .......................................................... 703/2
See application file for complete search history.

(56) References Cited

U.S. PATENT DOCUMENTS

| | | |
|---|---|---|
| 4,347,745 A | 9/1982 | Singh |
| 4,400,681 A | 8/1983 | Brown et al. |
| 4,771,427 A | 9/1988 | Tulpule et al. |
| 4,825,876 A | 5/1989 | Beard |
| 4,888,662 A | 12/1989 | Bishop |
| 4,903,164 A | 2/1990 | Bishop et al. |
| 5,060,108 A | 10/1991 | Baker et al. |
| 5,101,659 A | 4/1992 | Takeuchi |
| 5,101,665 A | 4/1992 | Mizuno |
| 5,144,843 A | 9/1992 | Tamura et al. |
| 5,173,766 A | 12/1992 | Long et al. |
| 5,181,417 A | 1/1993 | Nishida et al. |
| 5,184,107 A | 2/1993 | Maurer |
| 5,184,515 A | 2/1993 | Terry et al. |
| 5,209,121 A | 5/1993 | Hafner |
| 5,222,397 A | 6/1993 | Kodama |
| 5,231,301 A | 7/1993 | Peterson et al. |
| 5,284,107 A | 2/1994 | Milne et al. |
| 5,331,857 A | 7/1994 | Levine et al. |
| 5,349,865 A | 9/1994 | Kavli et al. |
| 5,425,371 A | 6/1995 | Mischenko |
| 5,448,444 A | 9/1995 | Provenzano et al. |
| 5,457,988 A | 10/1995 | Delatorre |
| 5,587,535 A | 12/1996 | Sasaki et al. |
| 5,625,151 A | 4/1997 | Yamaguchi |
| 5,629,486 A | 5/1997 | Viduya et al. |
| 5,665,921 A | 9/1997 | Gerst et al. |
| 5,741,975 A | 4/1998 | Vaughn, II et al. |
| 5,802,912 A | 9/1998 | Pitzer et al. |
| 5,866,822 A | 2/1999 | Willig |
| 5,869,766 A | 2/1999 | Cucci et al. |
| 6,033,544 A | 3/2000 | Demers et al. |
| 6,050,145 A | 4/2000 | Olson et al. |
| 6,070,883 A | 6/2000 | Marto |
| 6,119,524 A | 9/2000 | Kobold |
| 6,204,594 B1 | 3/2001 | Ingham |
| 6,351,998 B1* | 3/2002 | Hohnstadt ............ G01G 3/1402 73/804 |
| 6,389,903 B1 | 5/2002 | Oba et al. |
| 6,411,038 B2 | 6/2002 | Murai et al. |
| 6,439,058 B1 | 8/2002 | Aratani et al. |
| 6,453,747 B1 | 9/2002 | Weise et al. |
| 6,487,911 B1 | 12/2002 | Frackelton et al. |
| 6,536,287 B2 | 3/2003 | Beekhuizen et al. |
| 6,539,787 B1 | 4/2003 | Murai et al. |
| 6,568,276 B1* | 5/2003 | Ciminelli ............ G01L 9/0051 73/720 |
| 6,700,174 B1 | 3/2004 | Miu et al. |
| 6,715,357 B2 | 4/2004 | Ishiguro et al. |
| RE38,557 E | 7/2004 | Englund et al. |
| 6,763,724 B2 | 7/2004 | DiPaola et al. |
| 6,876,943 B2 | 4/2005 | Wegerich |
| 6,945,118 B2 | 9/2005 | Maitland, Jr. et al. |
| 6,952,042 B2 | 10/2005 | Stratton et al. |
| 7,021,147 B1 | 1/2006 | Subramanian |
| 7,032,456 B1 | 4/2006 | Amin |
| 7,114,396 B2 | 10/2006 | Oda et al. |
| 7,197,937 B2 | 4/2007 | Amore et al. |
| 7,207,214 B1 | 4/2007 | Wlodarczyk |
| 7,302,855 B2 | 12/2007 | Oda |
| 7,316,164 B2 | 1/2008 | Toyoda et al. |
| 7,383,737 B1 | 6/2008 | Lin et al. |
| 7,412,894 B2 | 8/2008 | Ueyanagi et al. |
| 7,518,234 B1 | 4/2009 | Okojie |
| 7,555,957 B2 | 7/2009 | Toyoda |
| 7,570,065 B2 | 8/2009 | Harish et al. |
| 7,578,194 B1 | 8/2009 | Hadjiloucas et al. |
| 7,726,197 B2 | 6/2010 | Selvan et al. |
| 7,739,922 B2 | 6/2010 | Inamori |
| 7,775,119 B1 | 8/2010 | Suminto et al. |
| 8,024,978 B2 | 9/2011 | Khemet et al. |
| 8,056,752 B2 | 11/2011 | Carnevali |
| 8,104,357 B2 | 1/2012 | Schlitzkus et al. |
| 8,129,624 B2 | 3/2012 | Willner et al. |
| 8,156,816 B2 | 4/2012 | Willner et al. |
| 8,164,007 B2 | 4/2012 | Speldrich et al. |
| 8,215,176 B2 | 7/2012 | Ding et al. |
| 8,250,909 B2 | 8/2012 | Kern et al. |
| 8,297,115 B2 | 10/2012 | Borgers et al. |
| 8,429,956 B2 | 4/2013 | Borgers et al. |
| 8,516,897 B1 | 8/2013 | Jones et al. |
| 8,627,559 B2 | 1/2014 | Suminto et al. |
| 8,671,767 B2 | 3/2014 | Kaiser et al. |
| 8,950,247 B2 | 2/2015 | Borgers et al. |
| 8,984,949 B2 | 3/2015 | Staiger et al. |
| 9,003,897 B2 | 4/2015 | Wade et al. |
| 9,046,436 B2 | 6/2015 | Schlitzkus et al. |
| 9,063,033 B2 | 6/2015 | Mayer et al. |
| 2001/0015402 A1 | 8/2001 | Murai et al. |
| 2001/0039837 A1 | 11/2001 | Tanizawa et al. |
| 2002/0029639 A1 | 3/2002 | Wagner et al. |
| 2002/0073533 A1 | 6/2002 | Park |
| 2002/0100948 A1* | 8/2002 | Yoshihara ............ G01L 9/0054 257/415 |
| 2003/0033884 A1 | 2/2003 | Beekhuizen et al. |
| 2003/0150275 A1 | 8/2003 | Wagner et al. |
| 2004/0007073 A1 | 1/2004 | Weise |
| 2004/0007074 A1 | 1/2004 | DiPaola et al. |
| 2004/0007075 A1 | 1/2004 | Ishiguro et al. |
| 2004/0015282 A1 | 1/2004 | Babala et al. |
| 2004/0020300 A1 | 2/2004 | Boehler et al. |
| 2004/0132900 A1 | 7/2004 | Sachdev et al. |
| 2004/0146719 A1 | 7/2004 | Baney et al. |
| 2004/0147140 A1 | 7/2004 | Fan et al. |
| 2004/0200286 A1 | 10/2004 | Mast |
| 2005/0011273 A1 | 1/2005 | Sasaki et al. |
| 2005/0103111 A1 | 5/2005 | Imai et al. |
| 2005/0252300 A1 | 11/2005 | Miller |
| 2006/0000289 A1 | 1/2006 | Jonsson |
| 2006/0042393 A1 | 3/2006 | Kaneko et al. |
| 2006/0042394 A1 | 3/2006 | Kosh et al. |
| 2006/0042395 A1 | 3/2006 | Lepine et al. |
| 2006/0053894 A1 | 3/2006 | Kunda et al. |
| 2006/0090566 A1 | 5/2006 | Oda |
| 2006/0123887 A1 | 6/2006 | Dordet |
| 2006/0214202 A1 | 9/2006 | Zorich et al. |
| 2006/0278012 A1 | 12/2006 | Fujimoto et al. |
| 2007/0148788 A1 | 6/2007 | Hsieh et al. |
| 2007/0154631 A1 | 7/2007 | Sachdev et al. |
| 2007/0202628 A1 | 8/2007 | Wuertz |
| 2007/0205776 A1 | 9/2007 | Harish et al. |
| 2008/0148860 A1 | 6/2008 | Murakami et al. |
| 2008/0222884 A1 | 9/2008 | Bradley et al. |
| 2008/0262584 A1 | 10/2008 | Bottomley et al. |
| 2009/0071260 A1 | 3/2009 | Speldrich |
| 2009/0075529 A1 | 3/2009 | Johnston et al. |
| 2009/0282926 A1 | 11/2009 | Hauer et al. |
| 2009/0315864 A1 | 12/2009 | Silverbrook et al. |
| 2009/0320576 A1 | 12/2009 | Borgers et al. |
| 2010/0052578 A1 | 3/2010 | Kim |
| 2010/0192696 A1 | 8/2010 | Schlitzkus et al. |
| 2010/0219487 A1 | 9/2010 | Donis |
| 2010/0239109 A1 | 9/2010 | Lutz et al. |
| 2010/0267291 A1 | 10/2010 | Chabineau-Lovgren et al. |
| 2010/0281994 A1 | 11/2010 | Brown et al. |
| 2011/0088480 A1 | 4/2011 | Koehler et al. |
| 2011/0108322 A1 | 5/2011 | Kaiser |
| 2011/0153277 A1 | 6/2011 | Morath |
| 2011/0290030 A1 | 12/2011 | Willner et al. |
| 2011/0320158 A1 | 12/2011 | Steckenreiter et al. |
| 2012/0067130 A1 | 3/2012 | Kaiser et al. |

(56) References Cited

U.S. PATENT DOCUMENTS

| | | |
|---|---|---|
| 2012/0227477 A1 | 9/2012 | Borgers et al. |
| 2013/0052936 A1 | 2/2013 | Jordan |
| 2013/0073189 A1 | 3/2013 | Korenaga et al. |
| 2013/0192379 A1 | 8/2013 | Petrarca |
| 2013/0248024 A1 | 9/2013 | Dunn et al. |
| 2013/0264664 A1 | 10/2013 | Nimura et al. |
| 2013/0336511 A1 | 12/2013 | Underbrink et al. |
| 2014/0130585 A1 | 5/2014 | Borgers et al. |
| 2014/0130586 A1 | 5/2014 | Zwollo et al. |
| 2014/0144206 A1 | 5/2014 | Uehlin et al. |
| 2014/0219713 A1 | 8/2014 | Balsells et al. |
| 2014/0260648 A1 | 9/2014 | Aoyama et al. |
| 2014/0338448 A1 | 11/2014 | Ashino |
| 2015/0135853 A1 | 5/2015 | McNeal et al. |
| 2015/0377729 A1 | 12/2015 | Hio et al. |
| 2016/0025581 A1 | 1/2016 | Kazama et al. |
| 2016/0133762 A1 | 5/2016 | Blasco Claret |
| 2016/0265998 A1 | 9/2016 | Lavado et al. |
| 2016/0282205 A1 | 9/2016 | Huo et al. |

FOREIGN PATENT DOCUMENTS

| | | |
|---|---|---|
| DE | 4407212 C1 | 8/1995 |
| DE | 102004048367 A1 | 4/2006 |
| EP | 085584 A1 | 8/1983 |
| EP | 1074827 A2 | 2/2001 |
| EP | 1211497 A2 | 6/2002 |
| EP | 1560012 A1 | 8/2005 |
| EP | 1826543 A2 | 8/2007 |
| EP | 2390641 A2 | 11/2011 |
| EP | 2620757 A1 | 7/2013 |
| EP | 2848908 A1 | 3/2015 |
| FR | 2791430 A1 | 9/2000 |
| GB | 2066590 A | 7/1981 |
| JP | 406037334 | 2/1994 |
| JP | 2010256187 A | 11/2010 |
| WO | WO-0242720 A2 | 5/2002 |
| WO | WO-2003100371 A1 | 12/2003 |
| WO | WO-2006102460 A1 | 9/2006 |
| WO | WO-2011155054 A1 | 12/2011 |
| WO | WO-2013083320 A1 | 6/2013 |
| WO | WO-2013110045 A1 | 7/2013 |
| WO | WO-2014132730 A1 | 9/2014 |

\* cited by examiner

METHOD OF MANUFACTURING A PRESSURE SENSOR

CROSS-REFERENCE TO RELATED APPLICATION

This application claims priority to European Patent Application No. 16166285.3 filed Apr. 20, 2016, which is incorporated herein by reference.

TECHNICAL FIELD

The subject technology relates to a method of manufacturing a strain gage based pressure sensor for measuring a fluid pressure in a device. More particularly, the subject technology relates to method for determining the positions of strain gages on a circular membrane with a fluid sensing side and a strain sensing side. The subject technology further relates to a pressure sensor with strain gages attached to a circular membrane.

BACKGROUND ART

Strain gage based pressure transducers are used to measure pressures, such as the pressure of fluids in a vehicle. A strain gage based pressure transducer that utilizes an integrated Wheatstone bridge exhibits a high over pressure capability, high output, low offset and linear output.

Conventional pressure transducers typically utilize four strain gages bonded to the membrane of a metal pressure port element. The membrane has a fluid side to be exposed to the fluid pressure and a strain sensing side. As is well known in the art, the gages are positioned on the strain sensing side of the membrane in such a way that two strain gages are put into compression and two strain gages are put into tension when pressure is applied to the diaphragm.

European patent no. EP2735855 discloses that it is possible to position one strain gage of a half Wheatstone bridge on a first distance from the center of the membrane with compressive strain and the other strain gage of the half Wheatstone bridge on a second distance from the center of the membrane with tensile strain to improve the accuracy of the electrical signal derived from the resistance values of the pair of strain gages.

However, after mounting the pressure sensor in a device, parasitic forces acting on the metal pressure port element introduce errors in the output signal of the sensor. Parasitic forces are forces other than fluid pressure acting on the metal pressure port and can consist of for instance mounting forces, thermal-mismatch forces and package forces. The error depends on the magnitude of the parasitic force and the position and orientation of force acting on the metal pressure port. The metal pressure port element comprises a sealing surface to provide a hermetic seal between the sensor and the device. The parasitic force could be in the form of a uniform force, point force or a combination of uniform force and point force acting on the sealing surface or other location of the port. The error in the output signal of the sensor due to parasitic forces could be significant.

SUMMARY

It is an object of the present technology to provide a method of manufacturing a strain gage based pressure sensor for measuring a fluid pressure in a device with decreased sensitivity in the output signal due to forces acting on the membrane other than the fluid pressure.

According to a first aspect of the subject technology, this object is achieved by a method of manufacturing a pressure sensor for measuring a fluid pressure in a device having the features of claim 1. Advantageous embodiments and further ways of carrying out the subject technology may be attained by the measures mentioned in the dependent claims.

In one embodiment, the subject technology is directed to a method of manufacturing a pressure sensor for measuring a fluid pressure in a device according to the subject technology comprises: providing a port element, the port element comprises a sealing structure and a membrane with a fluid side to be exposed to the fluid pressure and, a strain sensing side and a central axis, the sealing structure providing a seal when the port element is attached in an opening of the device, the membrane having a membrane central axis and the port element having a port central axis; positioning four strain gages to the strain sensing side in such a way that two strain gages are put in compressive strain and two strain gages are put into tensile strain when fluid pressure is applied to the circular membrane; and connecting the four strain gages to form a Wheatstone bridge circuit.

The method is further characterized in that the method further comprises a position determining action comprising the steps: generating a mathematical model of the port element; a first finite element action determining on the sensing side of the circular membrane with a finite element algorithm using the mathematical model a first circle with a first radius or contour with equal first strain sensitivity for pressure around the membrane central axis and a second circle with a second radius or contour with equal second strain sensitivity (with opposite sign) for pressure around the membrane central axis, wherein when fluid pressure simulation is applied to the membrane the degree of compression of the surface on the first circle or contour is equivalent to the degree of stretching of the surface on the second circle or contour; and, a second finite element action determining with a finite element algorithm using the mathematical model on the first circle or contour a first position for a first strain gage of the four strain gages and a fourth position for a fourth strain gage of the four strain gages and on the second circle or contour a second position for a second strain gage of the four strain gages and a third position for a third strain gage of the four strain gages, wherein when a characteristic parasitic force is applied to any location on the sealing structure or any other location of the port element the difference between the highest error signal and the lowest error signal measured by the a simulated Wheatstone bridge comprising the four strain gages attached to the corresponding determined four positions is minimal.

When attaching the four strain gages on the strain sensing side of the membrane two of the four strain gages are positioned on the first and fourth position on the first circle or contour and the other two strain gages are positioned on the second and third position on the second circle or contour.

European patent no. EP2735855 teaches that the position of the strain gages put in compressive strain have a first distance R1 from the center of a concentric membrane and the position of the strain gages put in tensile strain have a second distance R2 from the center of the concentric membrane. Accordingly, the positions of the two strain gages put in compressive strain can be anywhere on a circle with radius R1 and the two strain gages put in tensile strain can be anywhere on a circle with a radius R2. This is due to the circular symmetric dimensions of the membrane. That is why in literature configurations can be found where the two configurations of two strain gages forming a half-bridge are positioned at 180° and 90° as disclosed in U.S. Pat. No. 7,412,892.

The subject technology is based on the effect that when applying a parasitic force at the circumference of the port element the error introduced in the output signal of the full Wheatstone bridge formed by the four strain gages depends on the location where parasitic forces are applied on the port element and where the strain gages are positioned on the membrane and what the strain sensitive direction of the respective strain gages on the membrane is. Each half bridge gages combination has its own parasitic force error characteristic curves. It has been found that by selecting the proper rotation angle between the two half bridge gages around the centre of the membrane given a predefined parasitic force, the variation between the maximum error and minimum error due to the parasitic force in the output signal of the full Wheatstone bridge could be minimized for pressure sensors. Furthermore, in case of discrete rotational symmetric port element of the 6th order pressure port element, known as a hexagonal port plug, the present method could also be used to find the positions for the four strain gages on the membrane with the least variation in the error due to any parasitic force acting on the outside of the port element and a good sensitivity for measuring pressure of the fluid. For concentric or circular membranes the contour on the sensing side with equal strain given a fluid force acting on the membrane is a circle. Pressure sensors manufactured by for instance MEMS technology could have a membrane with a non-circular circumference. In case of a membrane with a non-circular circumference the contour has a shape between the shape of the membrane circumference and a circle.

In an embodiment, the first finite element action uses the degree of radial compressive strain on the sensing side to determine the first contour and the degree of radial tensile strain on the sensing side to determine the second contour. In an alternative embodiment, the first finite element action uses the degree of radial compressive strain on the sensing side to determine the first contour and the degree of tangential tensile strain on the sensing side to determine the second contour. These features allows to find a first and second contour for positioning the gages which provides the best sensitivity for fluid pressure acting on the membrane. The contour is then used as a starting point to find the combination positions for the strain gages on the contours which are the least sensitive for parasitic forces acting on the port element.

The second finite element action may further determine with the finite element algorithm the first to fourth position of the four strain gages by simulating a uniform force acting on the sealing structure and the highest error signal measured by the simulated Wheatstone bridge is minimal. This feature enables to reduce the influence of unpredictable mounting forces in the output signal of the pressure sensor further.

In a second aspect, there is provided a pressure sensor for measuring a fluid pressure in a device. The sensor comprises a metal port element. The port element comprises a sealing structure and a membrane with a fluid side to be exposed to the fluid pressure and a strain sensing side. The membrane further comprises a central axis. The sealing structure provides a seal when the port element is affixed in an opening of a device. Four strain gages are attached to the strain sensing side at a position such that two strain gages are put in compression and two strain gages are put into tension when fluid pressure is applied to the circular membrane. The four strain gages are electronically connected to form a Wheatstone bridge circuit. The position of the four strain gages is determined by a position determining action as defined by any of the appended method claims. By determining in advance the optimal positions of the four strain gages by the method described in the present application, the best positions could be found for each specific application such that the sensitivity for parasitic forces is minimal. For example, low pressure sensing applications, high pressure sensing applications, auto motive applications, home applications, etc.

Other features and advantages will become apparent from the following detailed description, taken in conjunction with the accompanying drawings which illustrate, by way of example, various features of embodiments. It should be appreciated that the subject technology can be implemented and utilized in numerous ways, including without limitation as a process, an apparatus, a system, a device, a method for applications now known and later developed.

BRIEF DESCRIPTION OF THE DRAWINGS these and other aspects, properties and advantages will be explained hereinafter based on the following description with reference to the drawings, wherein like reference numerals denote like or comparable parts, and in which.

Figure 6:
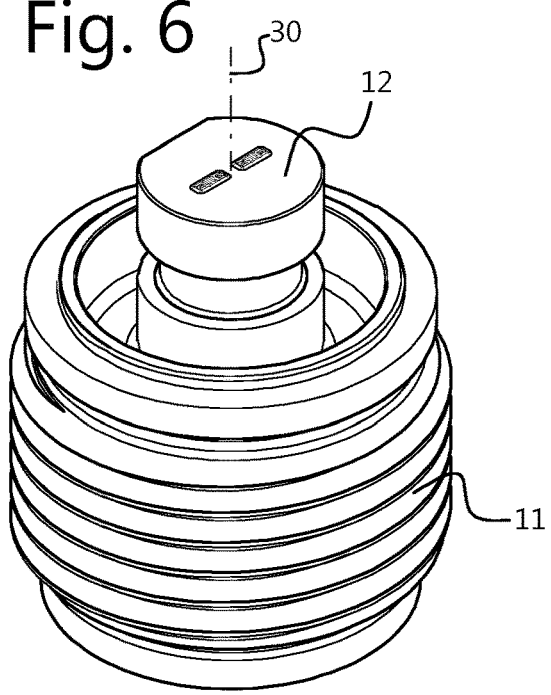
Figure 7:
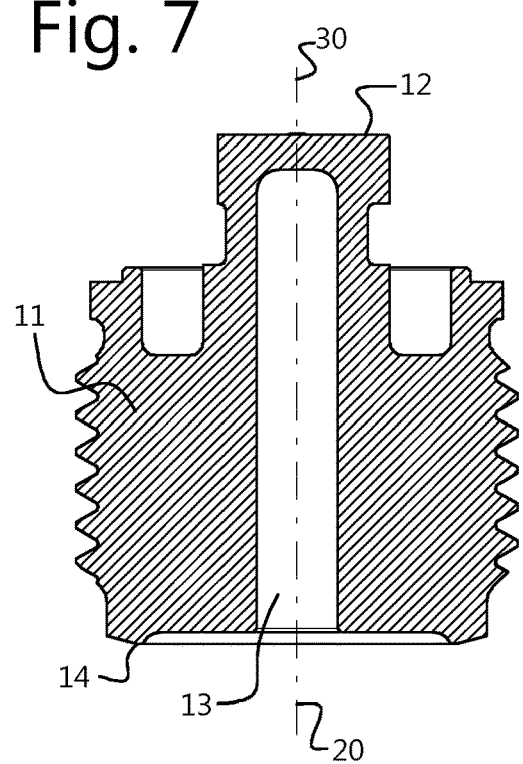
Figure 8:
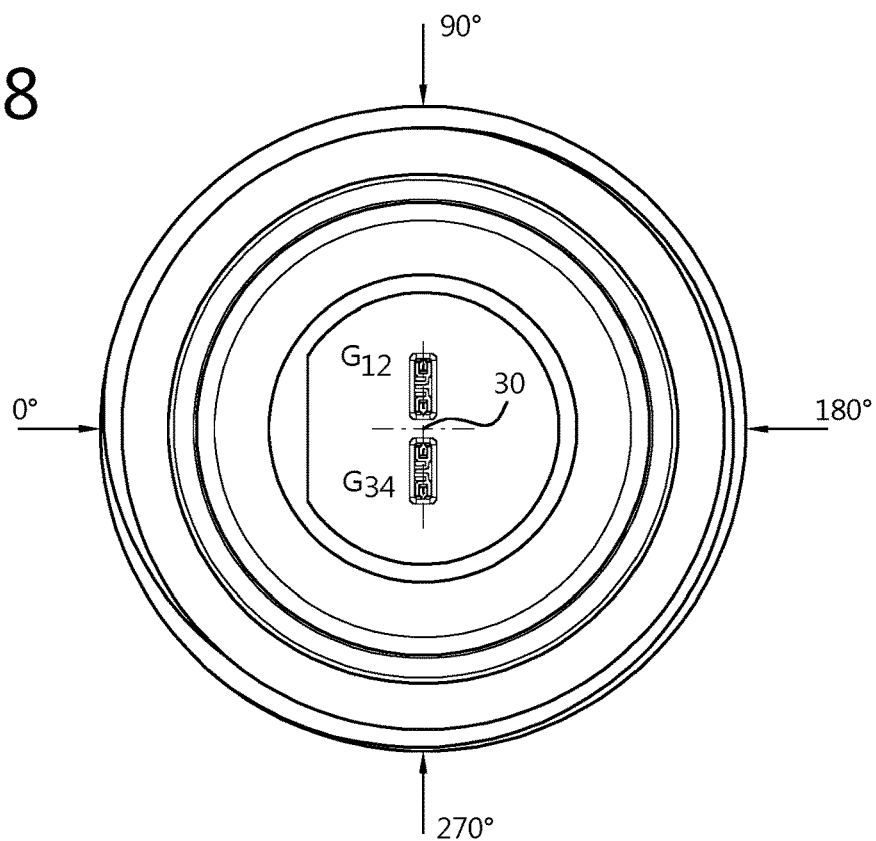
Figure 9:
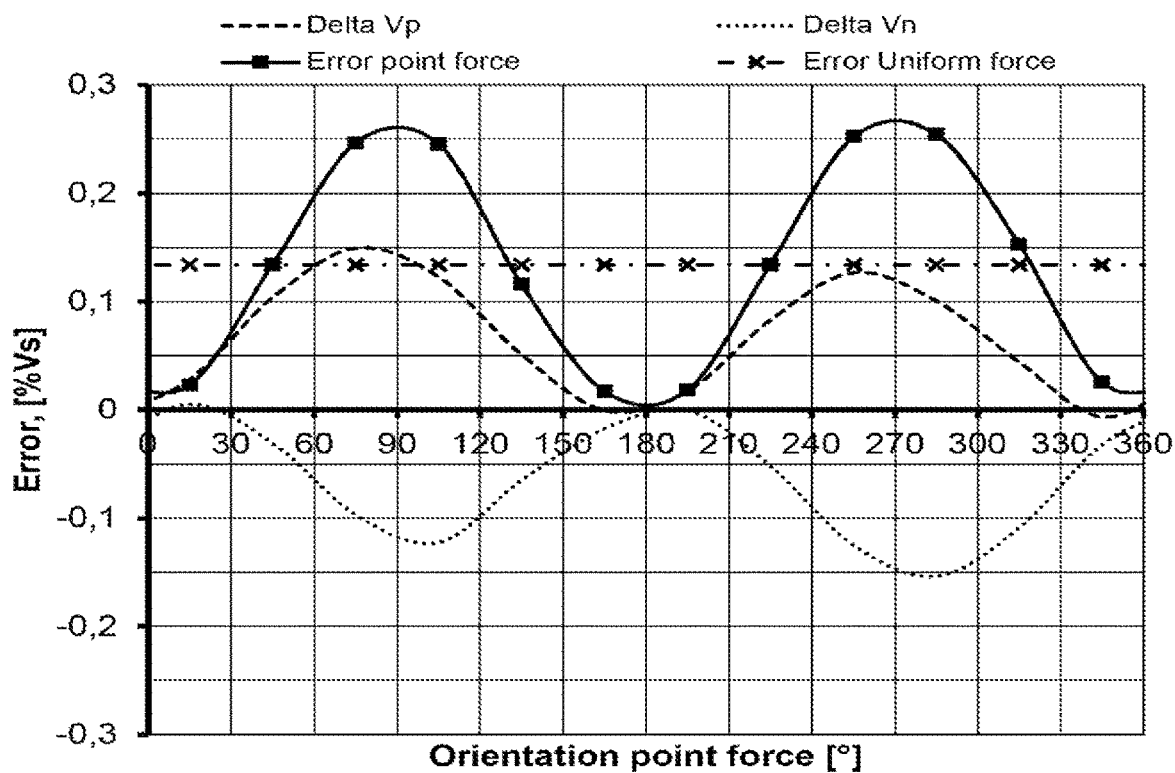
Figure 10:
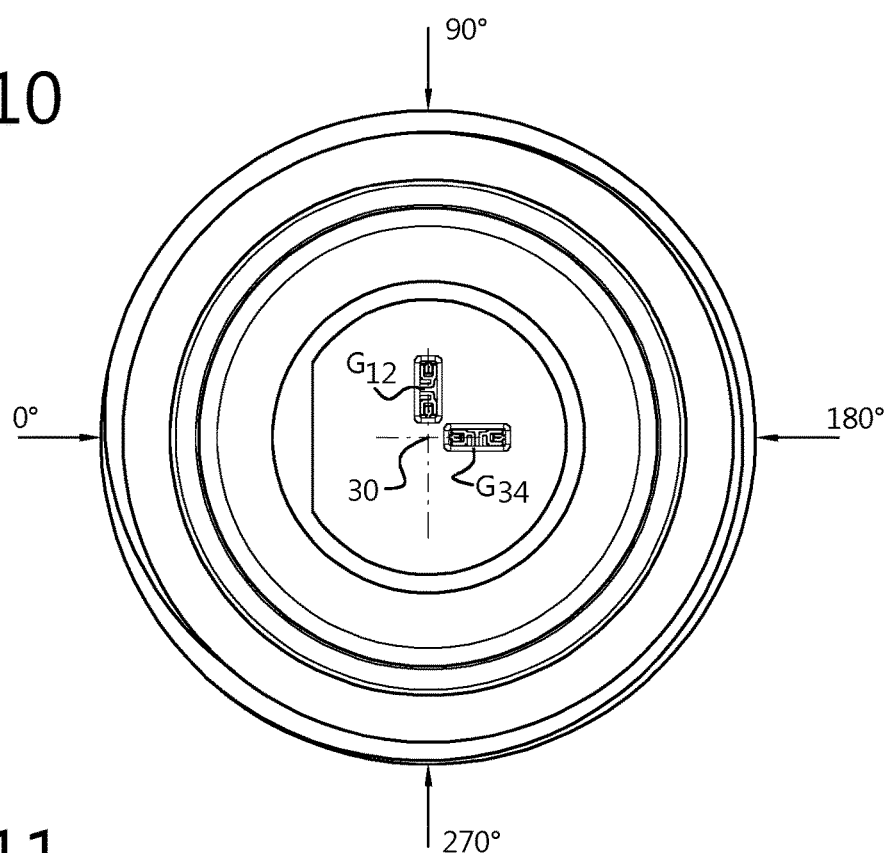
Figure 11:
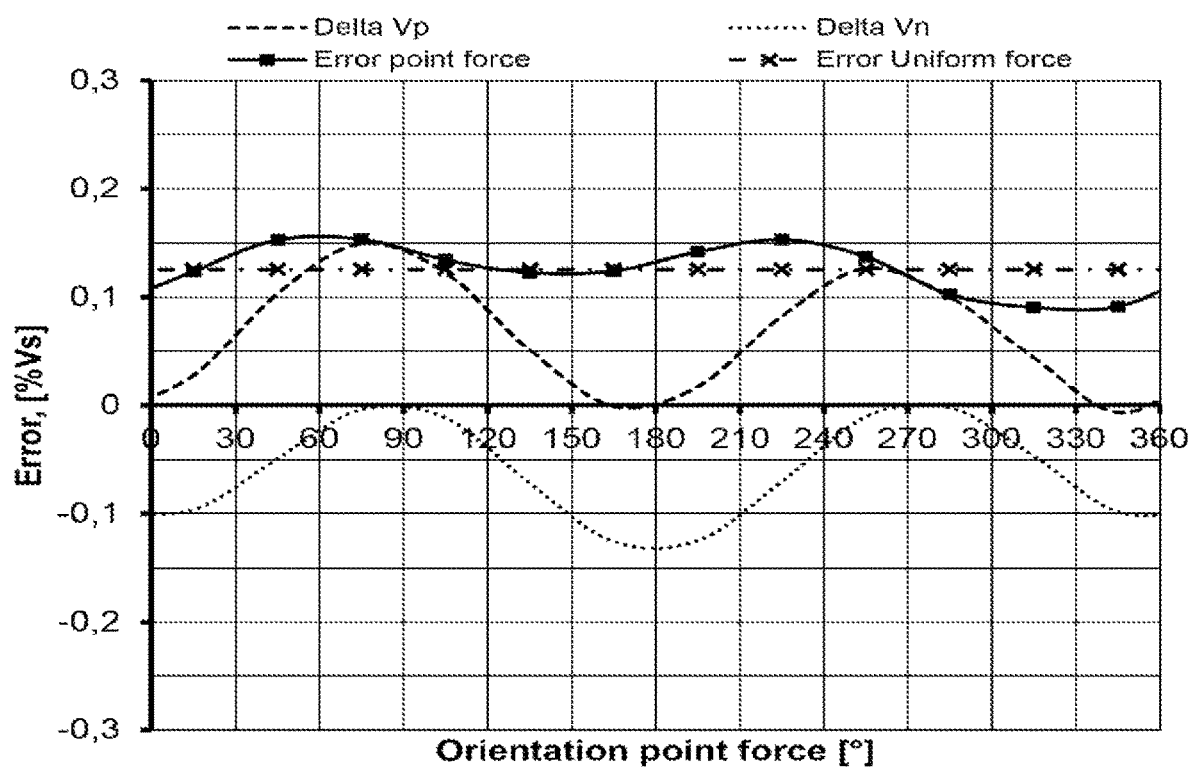
Figure 12:
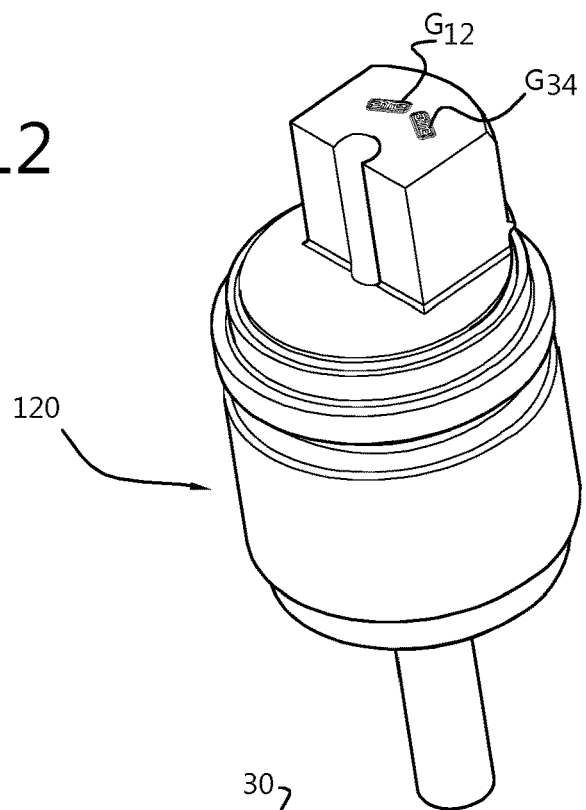
Figure 13:
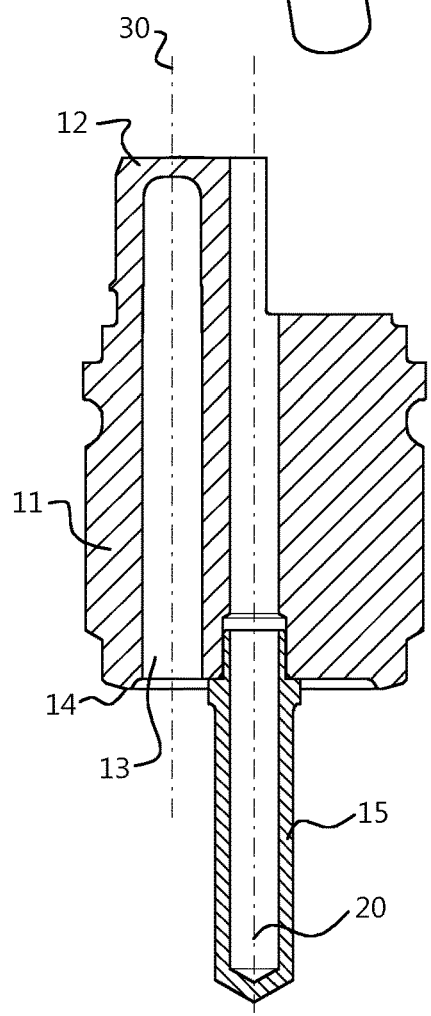
Figure 14:
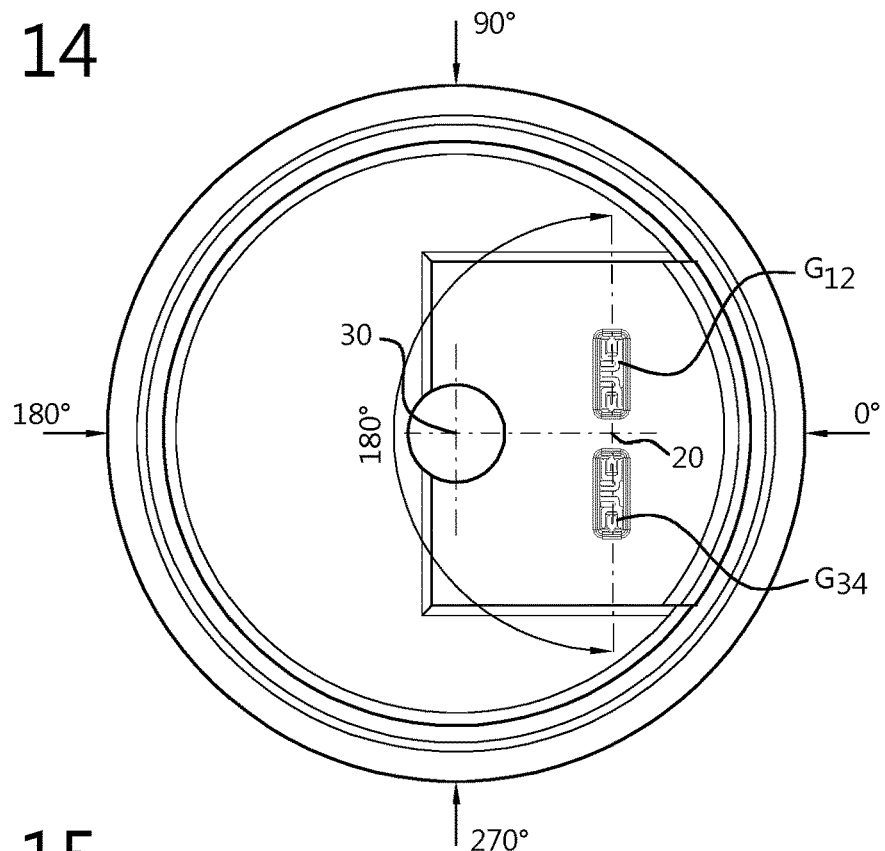
Figure 15:
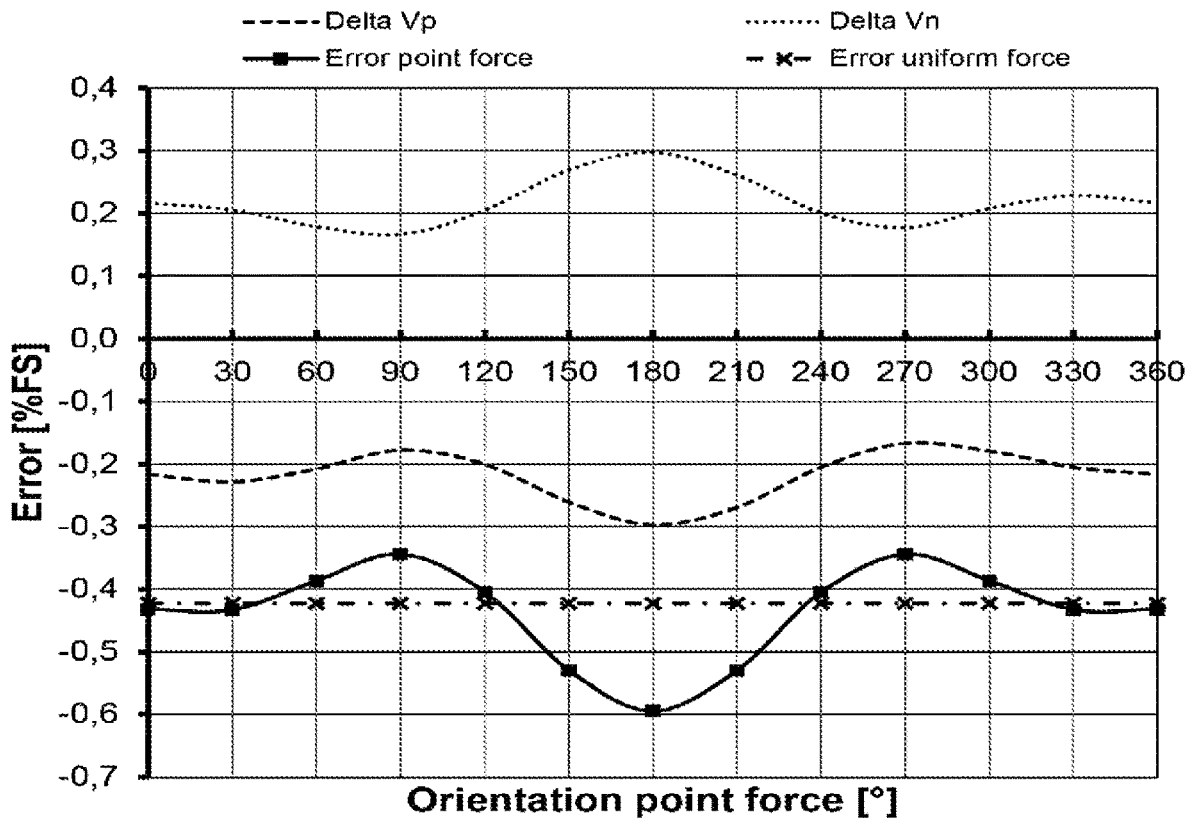
Figure 16:
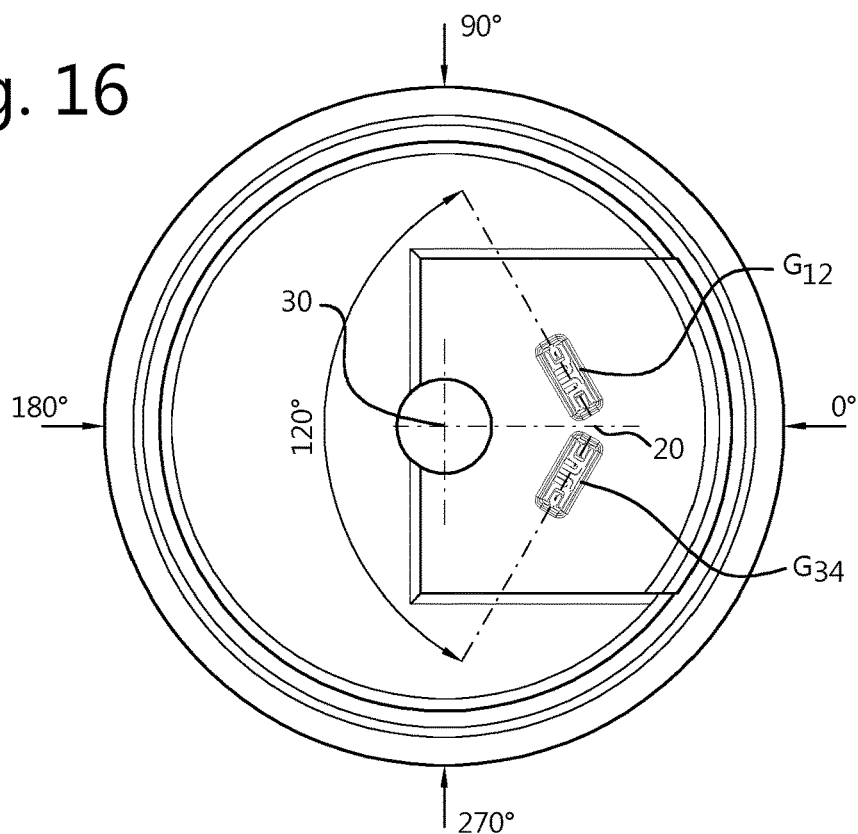
Figure 17:
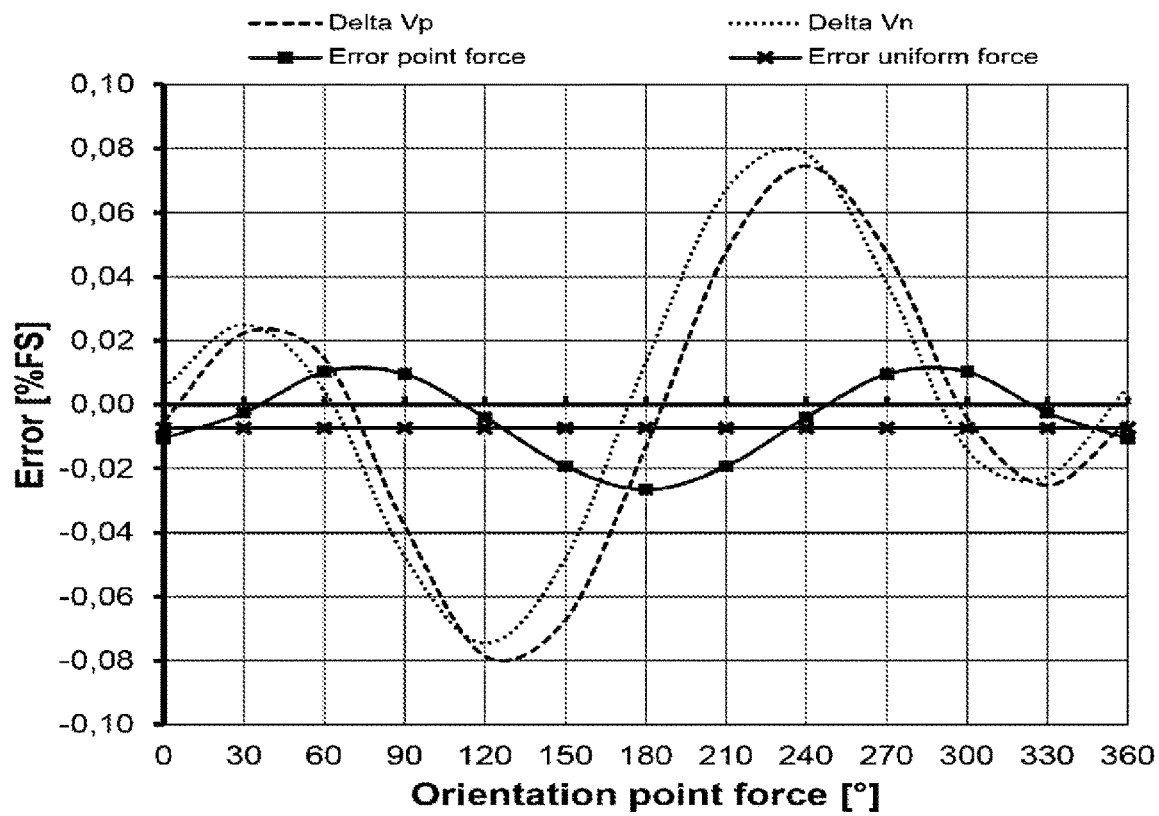
Figure 18:
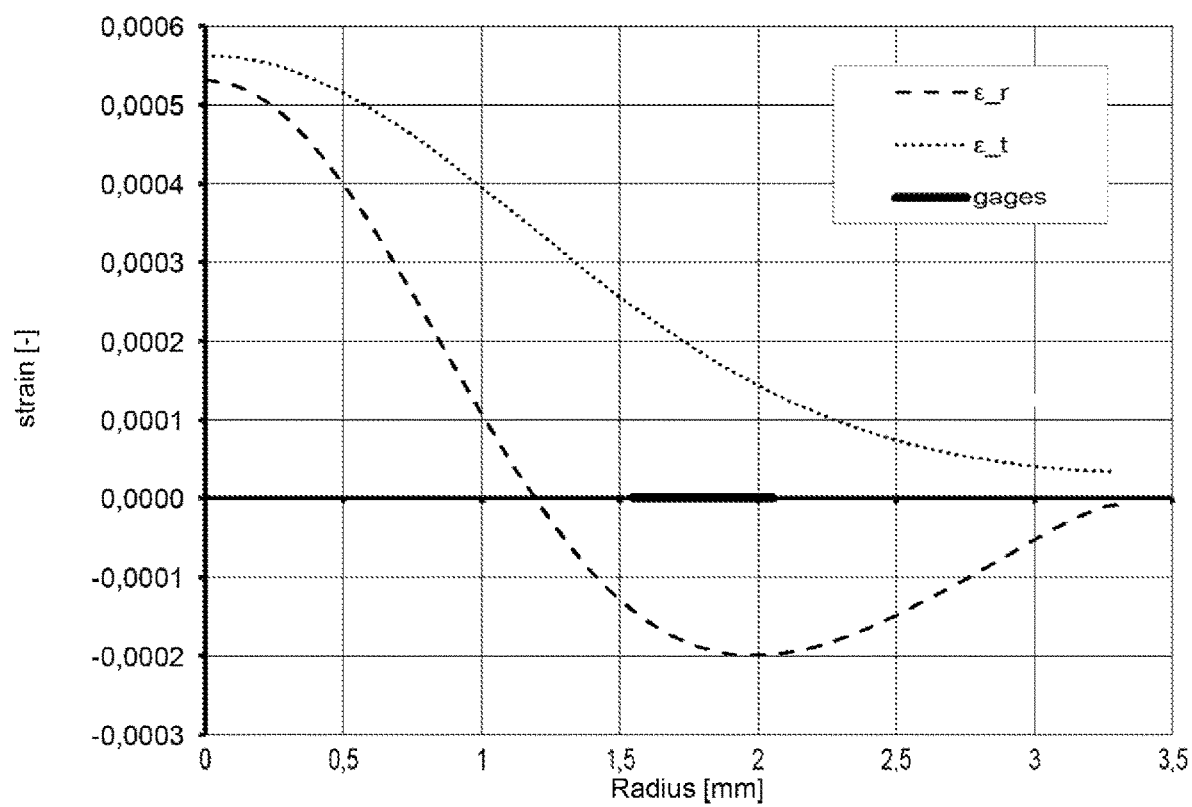

FIGS. 6, 7, and 8 show schematically a perspective view, a cross sectional view and a top view of a concentric pressure port element with two half bridge strain gages at 180° respectively;

FIG. 9 shows a graph with the error at the output of the Wheatstone bridge as a function of the direction of a point force for the port element in FIG. 8;

FIG. 10 shows schematically a top view of the concentric pressure port element in FIG. 6 with two half bridge strain gages at 90°;

FIG. 11 shows a graph with the error at the output of the Wheatstone bridge as a function of the direction of a point force for the port element in FIG. 10;

FIGS. 12, 13, and 14 show schematically a perspective view, a cross sectional view and a top view of a non-axial symmetric pressure port element with two half bridge strain gages, respectively;

FIG. 15 shows a graph with the error at the output of the Wheatstone bridge as a function of the direction of a point force for the port element in FIG. 14 with half bridge gages at 180°;

FIG. 16 shows schematically a top view of the non-axial symmetric pressure port element in FIG. 12 with two half bridge strain gages at 120°;

FIG. 17 shows a graph with the error at the output of the Wheatstone bridge as a function of the direction of a point force for the port element in FIG. 16; and FIG. 18 shows a graph with radial and tangential strain as a function of the radius.

DESCRIPTION OF EMBODIMENTS

The subject technology overcomes many of the prior art problems associated with manufacturing pressure sensors.

The advantages, and other features of the technology disclosed herein, will become more readily apparent to those having ordinary skill in the art from the following detailed description of certain preferred embodiments taken in conjunction with the drawings which set forth representative embodiments of the present invention and wherein like reference numerals identify similar structural elements.

As is understood by one of ordinary skill in the art, a strain gage based pressure sensor comprises a port element and four strain gages attached to a fluid pressure sensitive part of the port element. The four strain gages are electrically connected to form a Wheatstone bridge. The four strain gages have a position on a strain sensing side such that two strain gages are put in compressive strain and two strain gages are put in tensile strain when fluid pressure is applied to a fluid pressure side of the fluid pressure sensitive part of the port element.

Figure 1:
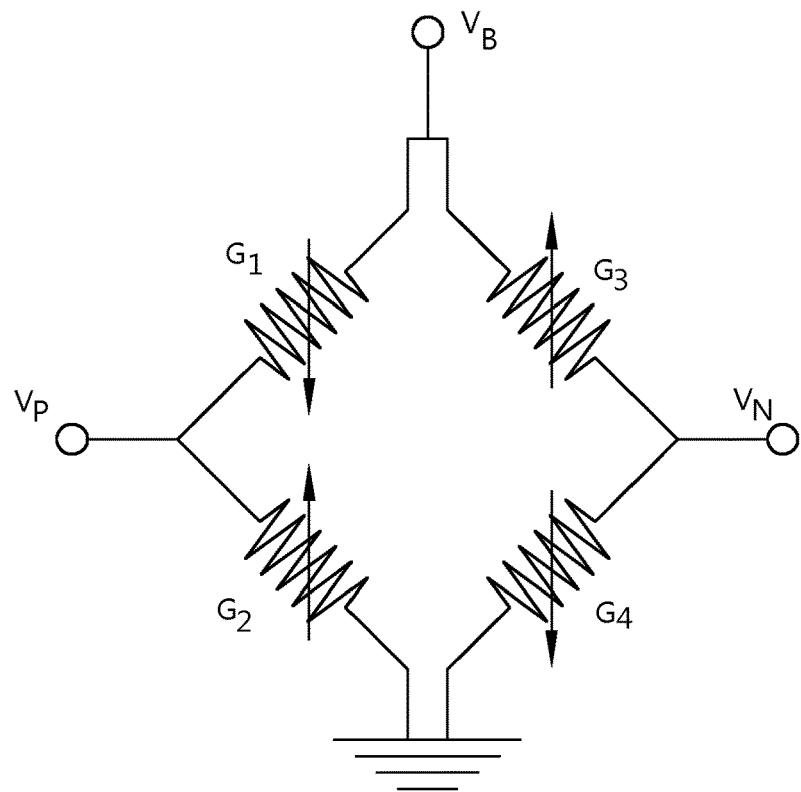
FIG. 1 shows schematically a full Wheatstone bridge for a strain gage based pressure sensor.

FIG. 1 shows schematically a Wheatstone bridge circuit diagram for a strain gage based pressure sensor. The Wheatstone bridge is the electrical equivalent of two parallel voltage divider circuits. R1 and R2 compose one voltage divider circuit, and R4 and R3 compose the second voltage divider circuit. The output of a Wheatstone bridge is measured between the middle nodes of the two voltage dividers.

Physical phenomena, such as a change in strain applied to a specimen or a temperature shift, changes the resistance of the sensing elements in the Wheatstone bridge. The Wheatstone bridge configuration is used to help measure the small variations in resistance that the sensing elements produce corresponding to a physical change in the specimen.

When a fluid pressure is applied gages G2 and G3 are put in tensile strain and gages G1 and G4 are put in compressive strain. An increase of compressive strain results in decrease of the resistance value of a strain gage and an increase of tensile strain results in increase of the resistance value of a strain gage. Strain gages G1 and G2 form a half bridge of the Wheatstone bridge and strain gages G3 and G4 form the other half bridge. The series connection of G1 and G2 and the series connection G3 and G4 are coupled at one side to voltage $V_B$ and at the other side to ground. The two strain gages forming a half bridge could be in the form of individual strain gages attached to the port element. In another embodiment, the two strain gages are combined to form one strain sensing element, also known as half bridge strain gage. When the fluid pressure increase, the voltage at the middle node $V_P$ increases and the voltage at the middle node $V_N$ decreases and consequently the voltage between $V_P$ and $V_N$ increases.

Figure 2:
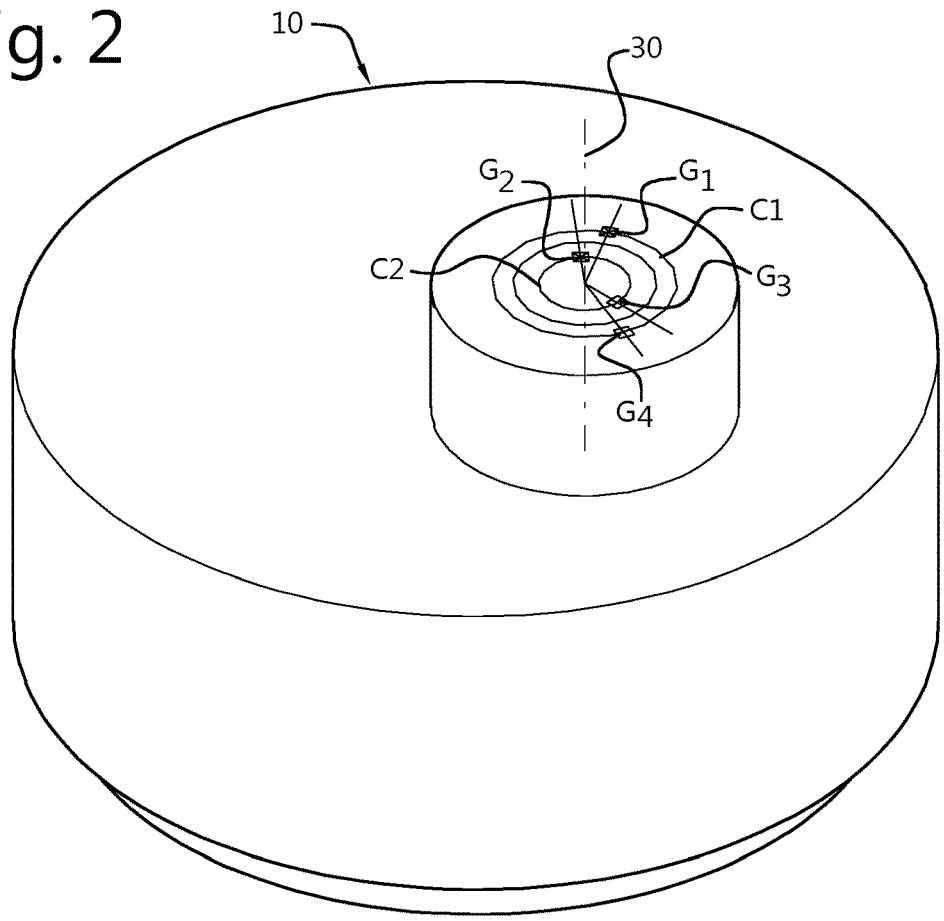
FIG. 2 shows schematically perspective view of a model of a pressure sensor.
Figure 3:
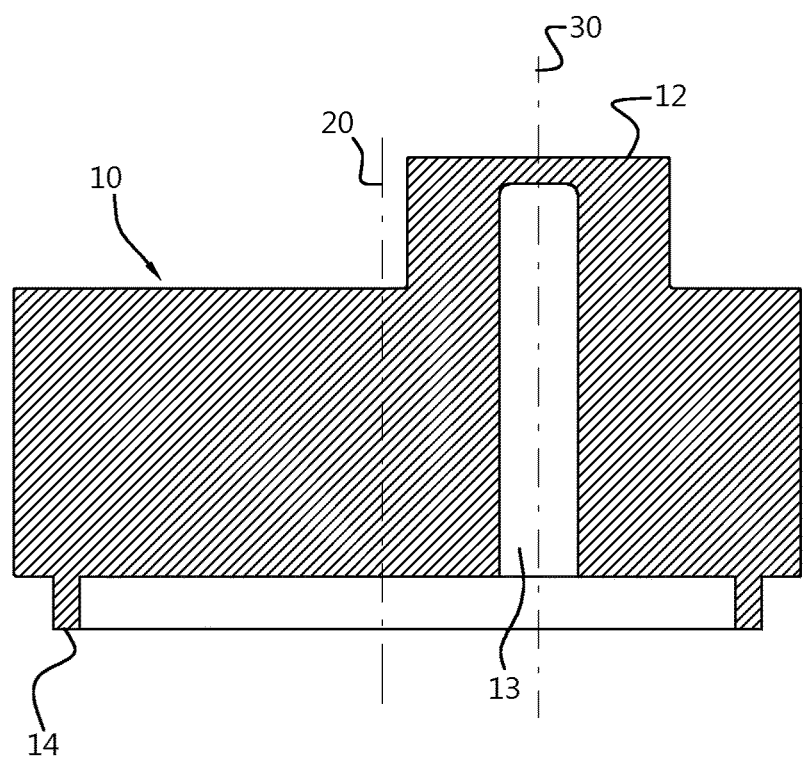
FIG. 3 shows schematically a cross sectional view of the model in FIG. 2.
Figure 4:
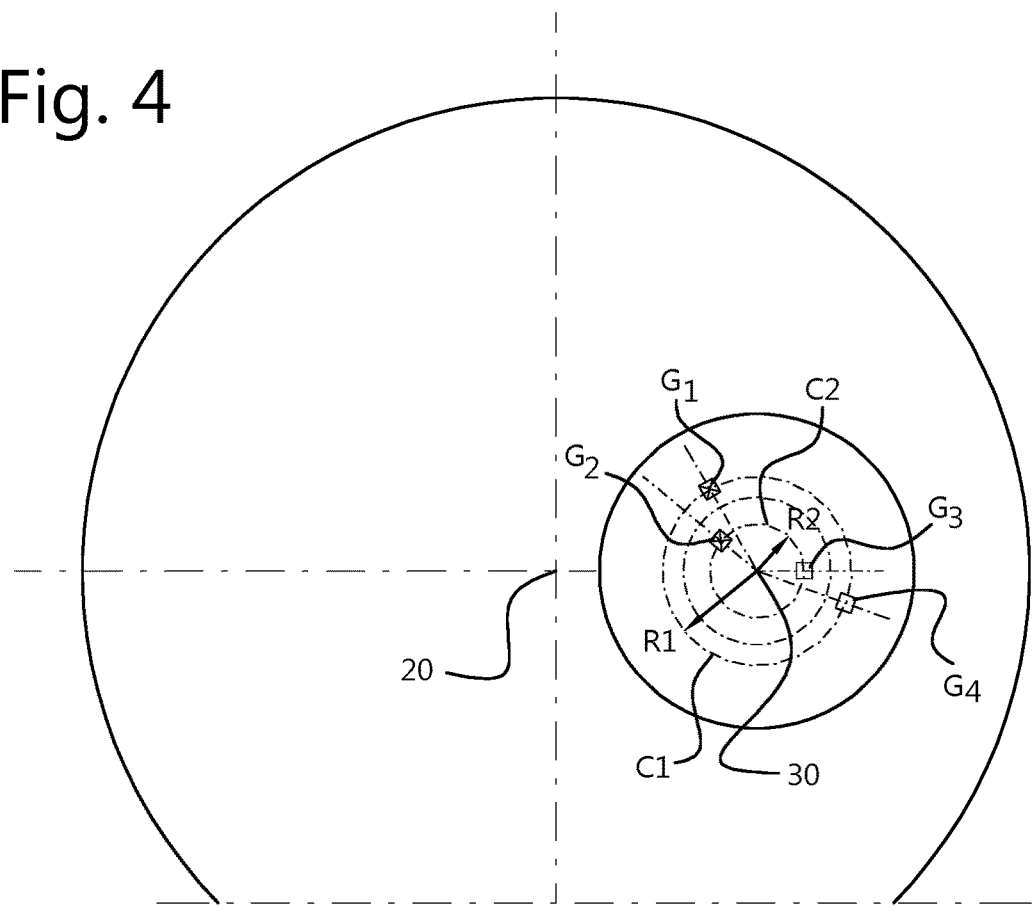
FIG. 4 shows schematically a top view of the model in FIG. 2.

FIG. 2 shows schematically perspective view of a model of a pressure sensor to elucidate the method of manufacturing a strain gage based pressure sensor according to the present application. More particular to elucidate the method to determine the positions of the four strain gages on the strain sensing side of a membrane part of the pressure port. FIG. 3 shows schematically a cross sectional view of the model in FIG. 2 and FIG. 4 shows schematically a top view of the model in FIG. 2.

The pressure sensor comprises a port element 10. The port element comprises a fluid pressure sensitive part with a circular membrane 12 and a sealing structure 14. Via pressure port 13 fluid pressure in the device exerts pressure force on the fluid pressure side of the membrane. Opposite to the fluid pressure side the circular membrane comprises a strain sensing side. The strain gages are attached to the port element in a commonly known way, for example as disclosed in U.S. Pat. No. 7,412,892B1.

The sealing structure 14 provides a seal when the port element 10 is attached in an opening of the device. The circular membrane 12 has a membrane central axis 30 and the port element has a port central axis 20. The sealing structure 14 is concentric and has a sealing central axis that coincides with the port central axis 20. The membrane central axis 20 does not coincide with the port central axis 20.

When fluid pressure is applied to the fluid pressure side of the membrane, the surfaces below gages G1 and G4 on circle C1 with radius R1 are put in radial direction in compressive strain and the surfaces below gages G2 and G3 on circle C2 with radius R2 are put in radial direction in tensile strain. This will be elucidated by means of FIG. 5.

Figure 5:
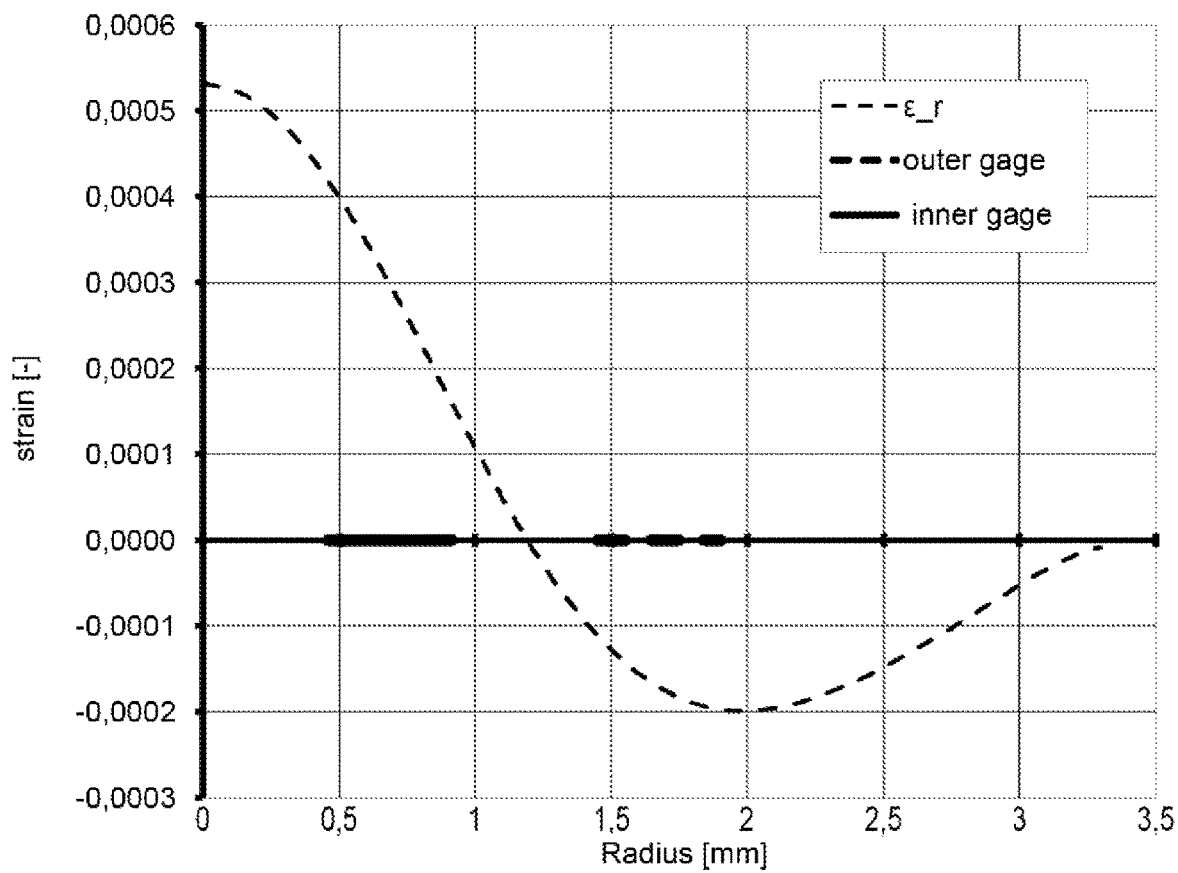
FIG. 5 shows a graph with radial strain at the strain sensing side of a membrane as a function of the radius.

FIG. 5 shows a graph with radial strain $\varepsilon\_r$ at the strain sensing side of a membrane as a function of the radius. Positive strain is strain with a positive value and corresponds to stretch in the surface in a particular direction resulting in tensile strain. Negative strain is strain with a negative value in the graph and corresponds to shrink in the surface in a particular direction resulting in compressive strain. It can be seen that the radial strain decrease with increase of the radius, i.e. the distance to the central axis 30. At a radius of about 1.2 mm the radial strain is almost zero. Then with increase of radius the radial strain becomes negative, i.e. shrink in radial direction. The highest shrink is at a radius of 2 mm. Then the amount of shrink decreases with increase of the radius.

The working principle of the strain based pressure sensors is that both strain gauges of the sensing electrical element measure radial strain but at two different radiuses. A characteristic of a strain gage is that the gage is sensitive for strain in a specific direction. By positioning a strain gage in such a way that the specific direction coincides a radius of the membrane, said strain gage will sense strain in radial direction and a change in resistance value of the strain gage depends substantially to a change in strain in radial direction of the membrane. In FIG. 4, which shows a top view of the circular sensing structure of FIG. 2, the radiuses are indicated with R1 and R2. In FIG. 5 are indicated the regions of radiuses measured by the two radial gauges of prior-art half bridge strain gages, for example a MSG (Microfused Silicon Strain Gage) as disclosed in U.S. Pat. No. 7,412,892B1. It can be seen from the graph that the inner strain gage at the inner circle C2 in FIG. 4 measures positive strain (tensile strain) and the outer strain gage at the outer circle C1 measures negative strain (compressive strain) when a pressure is applied to the fluid side of the membrane. The two strain gauges are used in a half bridge of a Wheatstone bridge.

One method to determine the positions of the strain gages comprises the following actions. First a mathematical model of the port element for use in a finite element algorithm is generated in a way known to the person skilled in the art. In a second action, a finite element algorithm is used to determine on the sensing side of the circular membrane by using the mathematical model of the port element to determine a first circle C1 around the membrane central axis 30 with a radius R1 and a second circle C2 around the membrane central axis 30 with a radius R2 wherein when fluid pressure is simulated to the circular membrane the degree of radial compression of the surface at the first circle C1 is equivalent to the degree of stretching of the surface at the second circle. The result of the second action is providing one combination of R1 and R2 which provides the positions for the two resistors of a half Wheatstone bridge with the best sensitivity in the output signal of the half Wheatstone bridge for measuring radial strain.

Subsequently, the finite element algorithm is used to determine on the first circle C1 a first position G1 and a fourth position G4 and on the second circle C2 a second position G2 and a third position G3 wherein when a parasitic force is applied to any location on the sealing structure the difference between the highest error signal and the lowest error signal measured by a simulated Wheatstone bridge comprising the four strain gages attached to the corresponding determined four positions is minimal. By this second finite element action, the best positions for the strain gages will be found on the circles with radii R1 and R2 which are the least sensitive for parasitic forces acting on for instance the sealing structure of the port element. This feature is important as normally the total mounting force acting on the port element is globally known, but how the mounting force is distributed along the sealing structure depends on a lot of factors, for example the flatness of the sealing surface of the port element and the flatness of the opposite sealing surface of the device. Furthermore, in practice the point on the sealing structure with the highest mounting force is unknown and consequently the error at the output of the Wheatstone bridge. It might be possible that by a little increase of total mounting force by screwing the pressure sensor more tightly in the device, the point with the highest force acting on the port element changes to another position on the sealing surface. The effect that the error in the output signal of the Wheatstone bridge due to a specified parasitic force varies along the sealing surface, gave us the insight that other angular positions of the half bridge strain gages might result is pressure sensors which are less sensitive for non-uniform mounting forces. This will be elucidated by two examples here below.

FIGS. 6, 7, and 8 show schematically a perspective view, a cross sectional view and a top view of a concentric pressure port element with two half bridge strain gages at 180° respectively. The sealing structure 14 is concentric and has a sealing central axis that coincides with a port central axis 20. Furthermore, the membrane central axis 30 coincides with the port central axis 20.

FIG. 9 shows a graph with the error at the output of the Wheatstone bridge as a function of the orientation/angle of a point force acting on the sealing surface 14 of the port element in FIG. 8. In FIG. 8 the orientation is indicated by the arrows 0°, 90°, 180° and 270°. The graph shows that the error (Delta $V_P$) at the output of the half bridge G12 comprising the gages G1 and G2 of the Wheatstone bridge in FIG. 1 varies with the orientation of the point force. The curve of the error Delta $V_P$ has a sinusoidal course. The highest error value is at about 80° and another top is at about 260°. The lowest error value is at about 345° and another minimum is at 170°. Both the two top values and the two bottom values differ; this is due to the flattened side of the upper part of the port element comprising the concentric membrane. Due to this flattened side, the port element is not fully concentric and this results in different curves for the interval 0-180° and the interval 180-360°.

The curve of the error Delta $V_N$ has also a sinusoidal course. The highest error value is at about 15° and another top is at about 195°. The lowest error value is at about 100° and another minimum is at 280°. The error at the output of the Wheatstone bridge corresponds to the solid line with squared markers and the name "Error point force". This error can be obtained by equation (1) as follows:

Error point force($x$)=Delta $V_P(x)$−Delta $V_N(x)$    (1)

wherein x is the angle of the point force at the sealing surface and has a value 0≤x<360.

Furthermore, in the graph of FIG. 9 the curve of the error due to a Uniform force is shown. This error is orientation independent and is a line with a constant value.

FIG. 10 shows schematically a top view of the concentric pressure port element in FIG. 6 with two half bridge strain gages at 90° and FIG. 11 shows a graph with the error at the output of the Wheatstone bridge as a function of the direction of a point force for the port element in FIG. 10. The curve of Delta $V_P$ in FIG. 11 is the same as the curve of Delta $V_P$ in FIG. 9 as the half bridge strain gage $G_{12}$ is at the same position on the port element. The curve of Delta $V_N$ in FIG. 11 looks like a 90° shifted version of the curve of Delta $V_N$ in FIG. 9. The curves of Delta $V_N$ are not equivalent due to the flattened side of the upper part of the port element comprising the membrane. This is caused by the fact that the port element is not fully concentric.

When comparing the curves in FIG. 9 and FIG. 11, it can be seen that the difference between the maximum error and minimum error in the output signal of the Wheatstone bridge (Error point force) in FIG. 11 is smaller than the difference between the maximum error and minimum error in the output signal of the Wheatstone bridge (Error point force) in FIG. 9. For this specific example the difference is improved with a factor of around 4. This means that a configuration with half bridge strain gages at 90° is less sensitive for the imperfections of the sealing surfaces than a configuration with half bridge strain gages at 180°. Further, by comparing the value of the Error caused by a uniform force acting on the sealing structure, it can be seen that the value of the error at the output of the Wheatstone bridge is almost the same. The difference is caused by the flattened side of the port element making it not fully concentric.

FIGS. 12, 13, and 14 show schematically a perspective view, a cross sectional view and a top view of a non-axial symmetric pressure port element with two half bridge strain gages, respectively. In this embodiment, the central axis of the membrane 12 does not coincide with the central axis 20 of the port element. The central axis 20 of the port element is the rotation axis of the port element when the threaded body part 11 of the port element is screwed in device. The central axis 20 is also the central axis of the sealing structure of the port element. In this embodiment, the port element comprises a bottomed metal tube 15 with its open side hermetically attached to the edge of a passage through the treaded body part of the port element. The bottomed metal tube 15 could be used to position a temperature sensor in the bottomed end to sense next to the pressure in a fluid also the temperature of the fluid in the device.

FIG. 15 shows a graph with the error at the output of two half bridge gages $G_{12}$, $G_{34}$ and the Wheatstone bridge as a function of the direction of a point force for the port element in FIG. 14 with half bridge gages at 180° and the half bridge gages are positioned symmetrically with respect to the plane of symmetry of the port element. It can be seen that the error Delta $V_P$ is always negative and the error Delta $V_N$ is always positive. The absolute minimal error at the output of the Wheatstone bridge is even bigger than the absolute highest error of the curves Delta $V_P$ and Delta $V_N$.

FIG. 16 shows schematically a top view of the non-axial symmetric pressure port element in FIG. 12 with two half bridge strain gages at 120°. FIG. 17 shows a graph with the error at the output of two half bridge gages $G_{12}$, $G_{34}$ and the Wheatstone bridge as a function of the direction of a point force for the port element in FIG. 14 with half bridge gages at 120° and the half bridge gages are positioned symmetrically with respect to the plane of symmetry of the port element. It can be seen that in this configuration the absolute values of Delta $V_P$ (see FIG. 17) are smaller than the minimum absolute value of Delta $V_P$ (see FIG. 15) for the configuration with gages at 180°. The same applies to the values of Delta $V_N$. The difference between the maximum value and minimum value of the error at the output of the Wheatstone bridge, curve Error point force, is about 0.04% FS (see FIG. 17) whereas for the 180° configuration the difference is 0.25% FS. FS means full scale. So by changing the angle between the two half bridge gages from 180° to 120° the sensitivity to point forces is reduced significantly (factor 6). It further reduced the sensitivity for uniform forces acting on the sealing structure from −0.432% FS to 0.007% FS (factor 62).

The examples given above demonstrate that by using the second finite element action which calculates for different positions of the first gage G1 and fourth gage G4 both measuring radial strain on the first circle C1 and different positions of the second gage G2 and the third gage G3 both measuring radial strain on the second circle C2 the corresponding curve of the error at the output of the Wheatstone bridge, it is possible to reduce the sensitivity of the pressure sensor for parasitic forces by attaching the four strain gages at the determined corresponding four positions.

However, it is also possible to use this method to determine better radial positions for the half bridge gages wherein one of the two strain gages of a half bridge gage measures radial strain and the other measures tangential strain. Tangential strain is strain in a direction perpendicular to a radius of the concentric membrane. FIG. 18 shows a graph with radial and tangential strain as a function of the radius. FIG. 18 shows the curve of radial strain ε_r as function of the radius as shown in FIG. 5. FIG. 18 shows further the curve of tangential strain ε_t as a function of the radius. The tangential strain decreases gradually with increase of the radius but is always positive. The graph shows that it is possible to measure both positive tangential tensile strain and negative radial compressive strain with comparable absolute values at positions on a circle with a radius of 1.7 mm.

The examples given above only take into account the mounting forces acting on the sealing surface to determine the positions on the first and second circle. Next to the mounting forces other parasitic forces could be taken into account. For example a part of the pressure sensor could be welded, pressed or crimped to the port element. This results in characteristic stress (=strain) in the membrane which differs over the manufactured products. This characteristic stress could be modelled as characteristic point forces acting on specific surfaces or locations of the port element. When also the magnitude of the different sources of parasitic forces is modelled, the positions on the first and second circle could be determined which are the least sensitive for the combination of all these parasitic force variations.

The examples given above to elucidate the method of the present application comprise a circular membrane. The first circle C1 with radius R1 and the second circle C2 with radius R2 are contours around the centre of the membrane with equal strain sensitivity due to fluid pressure acting on the membrane. The strain sensitivity of the surface on the strain sensing side at the first circle C1 has a value which is opposite to the strain sensitivity of the surface at the second circle C2. However, when the membrane has a non-circular circumference, for example a squared, rectangular of elliptical, the contours with equal sensitivity for pressure are not circular but have a shape between a circle and the shape of the circumference of the membrane. MEMS is for instance a technology that allows producing membranes with any shape of circumference. In that case, with the first finite element action, contours with equal strain sensitivity around the centre of the membrane are determined and subsequently the first contour and the second contour such that the sensitivity at the output of the Wheatstone bridge for fluid pressure is optimal. A constraint to find the first and second contour could be the distance between the centre of the measuring surface of the first strain gage and the centre of the measuring surface of the second strain gage of a half bridge strain gage. The first and second contour are used in the second finite element action to determine the positions for the strain gages on the two contours which are the least sensitive for any known parasitic force acting on the outside of the port element. By means of this method batches of fluid pressure sensors are manufactured which have the least spread in variation of the output signal of the pressure sensor due to mounting forces and/or stress in the port element due to attaching components of pressure sensor to the port element.

It will be appreciated by those of ordinary skill in the pertinent art that the functions of several elements may, in alternative embodiments, be carried out by fewer elements, or a single element. Similarly, in some embodiments, any functional element may perform fewer, or different, operations than those described with respect to the illustrated embodiment. Also, functional elements (e.g., components, modules, and the like) shown as distinct for purposes of illustration may be incorporated within other functional elements in a particular implementation.

While the subject technology has been described in terms of several embodiments, it is contemplated that alternatives, modifications, permutations and equivalents thereof will become apparent to those skilled in the art upon reading the specification and upon study of the drawings. All patents, patent applications and other references disclosed herein are hereby expressly incorporated in their entireties by reference. The subject technology is not limited to the illustrated embodiments. Changes can be made without departing from the scope of the appended claims.

The invention claimed is:
1. Method of manufacturing a pressure sensor for measuring a fluid pressure in a device, the method comprising:
  providing a port element, the port element comprising a sealing structure and a membrane with a fluid side to be exposed to the fluid pressure and a strain sensing side, the sealing structure providing a seal when the port element is attached in an opening of the device, the membrane having a membrane central axis and the port element having a port central axis;
  positioning four strain gages, including a first strain gage, a second strain gage, a third strain gage, and a fourth strain gage, to the strain sensing side in such a way that the first strain gage and the fourth strain gage are put in compressive strain when the fluid pressure is applied to the membrane and the second strain gage and the third strain gage are put into tensile strain when the fluid pressure is applied to the membrane;
  connecting the four strain gages to form a Wheatstone bridge circuit;
  performing position determining action including generating a mathematical model of the port element;
  a first finite element action determining, on the strain sensing side of the membrane with a first finite element algorithm using the mathematical model, a first contour around the membrane central axis with a first strain sensitivity for pressure and a second contour around the membrane central axis with a second strain sensitivity for pressure wherein when the fluid pressure is applied to the membrane a degree of compression of the surface on the first contour is equivalent to a degree of stretching of the surface on the second contour;

a second finite element action determining, with a second finite element algorithm using the mathematical model on the first contour, a first position for the first strain gage of the four strain gages and a fourth position for the fourth strain gage of the four strain gages and, on the second contour, a second position for the second strain gage of the four strain gages and a third position for the third strain gage of the four strain gages, wherein when a characteristic parasitic force is applied to any location on the sealing structure or any other location of the port element a difference between a highest error signal and a lowest error signal measured by a simulated Wheatstone bridge comprising the first strain gage attached to the first position, the second strain gage attached to the second position, the third strain gage attached to the third position, and the fourth strain gage attached to the fourth position, is minimal; and positioning the first strain gage on the first position, the second strain gage on the second position, the third strain gage on the third position, and the fourth strain gage on the fourth position, wherein the membrane is a circular membrane and the four strain gages are embodied as two half bridge strain sensing elements, each half bridge strain sensing element comprising two strain gages and a centre point in between, both half bridges measuring strain in a direction parallel to a line through the centre points; the centre points are at a defined distance from each other; the method includes determining a first circle and a second circle such that a difference between a radius of the first circle and a radius of the second circle equals the defined distance, the first position and the second position being determined by using a first radial line on the first and second circle, and the third position and fourth position being determined by using a second radial line on the first and second circle.

2. The method according to claim 1, wherein the first finite element action uses a degree of radial compressive strain on the strain sensing side to determine the first contour and a degree of radial tensile strain on the strain sensing side to determine the second contour.

3. The method according to claim 1, wherein the first finite element action uses a degree of radial compressive strain on the strain sensing side to determine the first contour and a degree of tangential tensile strain on the strain sensing side to determine the second contour.

4. The method according to claim 1, wherein the first position and the second position are on the first radial line and the third position and the fourth position are on the second radial line.

5. The method according to claim 1, wherein the port element is non-axially symmetric.

6. The method according to claim 1, wherein the sealing structure has a sealing central axis that does not coincide with the membrane central axis of the circular membrane.

7. The method according to claim 1, wherein the second finite element action further determines with the second finite element algorithm the first to fourth position of the four strain gages by simulating a uniform force acting on the sealing structure and the highest error signal measured by the simulated Wheatstone bridge is minimal.

8. The method according to claim 1, wherein the sealing structure is concentric.

9. The method according to claim 1, wherein the port element has at least one plane of symmetry.

10. A pressure sensor for measuring a fluid pressure in a device, the sensor comprising:

a port element including a sealing structure and a membrane with a fluid side to be exposed to the fluid pressure, a strain sensing side and a membrane central axis, the sealing structure providing a seal when the port element is affixed in an opening of the device;

four strain gages attached to the strain sensing side, including a first strain gage attached to a first position, a second strain gage attached to a second position, a third strain gage attached to a third position, and a fourth strain gage attached to a fourth position, such that the first strain gage and the fourth strain gage are put in compression when the fluid pressure is applied to the membrane and the second strain gage and the third strain gage are put into tension when the fluid pressure is applied to the membrane, the four strain gages are electronically connected to form a Wheatstone bridge circuit, wherein the first position, the second position, the third position, and the fourth position are determined by a position determining action including:

providing the port element, the port element having a port central axis;

performing position determining action including generating a mathematical model of the port element;

a first finite element action determining, on the strain sensing side of the membrane with a first finite element algorithm using the mathematical model, a first contour around the membrane central axis with a first strain sensitivity for pressure and a second contour around the membrane central axis with a second strain sensitivity for pressure wherein when the fluid pressure is applied to the membrane a degree of compression of the surface on the first contour is equivalent to a degree of stretching of the surface on the second contour; and a second finite element action determining, with a second finite element algorithm using the mathematical model on the first contour, the first position for the first strain gage of the four strain gages and the fourth position for the fourth strain gage of the four strain gages and, on the second contour, the second position for the second strain gage of the four strain gages and the third position for the third strain gage of the four strain gages, wherein when a characteristic parasitic force is applied to any location on the sealing structure or any other location of the port element the difference between a highest error signal and a lowest error signal measured by a simulated Wheatstone bridge comprising the first strain gage attached to the first position, the second strain gage attached to the second position, the third strain gage attached to the third position, and the fourth strain gage attached to the fourth position, is minimal, wherein the membrane is a circular membrane and the four strain gages are embodied as two half bridge strain sensing elements, each half bridge strain sensing element comprising two strain gages and a centre point in between, both half bridges measuring strain in a direction parallel to a line through the centre points; the centre points are at a defined distance from each other;

the position determining action includes determining a first circle and a second circle such that a difference between a radius of the first circle and a radius of the second circle equals the defined distance, the first position and second position being determined by using a first radial line on the first and second circle, and the third position and fourth position being determined by using a second radial line on the first and second circle.

11. A method of manufacturing a pressure sensor for measuring a fluid pressure in a device, the method comprising:

providing a port element, the port element comprising a sealing structure and a membrane with a fluid side to be exposed to the fluid pressure and a strain sensing side, the sealing structure providing a seal when the port element is attached in an opening of the device, the membrane having a membrane central axis and the port element having a port central axis;

mathematically modelling a first contour around the membrane central axis with a first strain sensitivity for pressure and a second contour around the membrane central axis with a second strain sensitivity for pressure;

positioning four strain gages to the strain sensing side, including a first strain gage attached to a first position, a second strain gage attached to a second position, a third strain gage attached to a third position, and a fourth strain gage attached to a fourth position, in such a way that the first strain gage and the fourth strain gage are positioned on the first contour and are put in compressive strain when fluid pressure is applied to the membrane and the second strain gage and the third strain gage are positioned on the second contour and are put into tensile strain when fluid pressure is applied to the membrane; and performing position determining action including generating a mathematical model of the port element, wherein the membrane is a circular membrane and the four strain gages are embodied as two half bridge strain sensing elements, each half bridge strain sensing element comprising two strain gages and a centre point in between, both half bridges measuring strain in a direction parallel to a line through the centre points; the centre points are at a defined distance from each other; the method includes determining a first circle and a second circle such that a difference between a radius of the first circle and a radius of the second circle equals the defined distance, the first position and second position being determined by using a first radial line on the first and second circle, and the third position and fourth position being determined by using a second radial line on the first and second circle.

* * * * *